United States Patent [19]

Ozaki et al.

[11] Patent Number: 4,575,825
[45] Date of Patent: Mar. 11, 1986

[54] SEMICONDUCTOR MEMORY DEVICE

[75] Inventors: Hideyuki Ozaki; Kazuhiro Shimotori, Fujishima; Kazuyasu; Hideshi Miyatake, all of Itami, Japan

[73] Assignee: Mitsubishi Denki Kabushiki Kaisha, Tokyo, Japan

[21] Appl. No.: 568,139

[22] Filed: Jan. 4, 1984

[30] Foreign Application Priority Data

Jan. 24, 1983 [JP] Japan .................... 58-11177

[51] Int. Cl.[4] ................................ G11C 11/40
[52] U.S. Cl. .................... 365/189; 365/130; 365/193; 365/194; 365/235
[58] Field of Search ............ 365/182, 189, 193, 230, 365/194

[56] References Cited

U.S. PATENT DOCUMENTS 4,156,938  5/1979  Proebsting et al. .
4,344,156  8/1982  Eaton, Jr. et al. .
4,491,910  1/1985  Caudel et al. .............. 365/189
4,510,602  4/1985  Engdahl et al. ............. 365/189

OTHER PUBLICATIONS

"A 100ns 64K Dynamic RAM Using Redundancy Techniques," by S. Sheffield et al., Feb. 18, 1981 IEEE, International Solid-State Circuits Conf. Proceedings, pp. 84-85.

Primary Examiner—Terrell W. Fears
Attorney, Agent, or Firm—Lowe King Price & Becker

[57] ABSTRACT

Disclosed is a semiconductor memory device which is one of three types of semiconductor memory devices, one operable only in page mode, one operable only in nibble and one operable selectively in page mode or nibble mode, being obtained from a partially unconnected semiconductor memory device through alternations in a portions in wiring. The semiconductor memory device includes first and second internal column address strobe signal generator. The second internal column address strobe signal generator has at the first stage thereof a NAND circuit one of inputs to which determines the type of the semiconductor memory device depending on which of three kinds of signals is selected as the input. Selection of such an input is effected by an aluminum wiring process using a mask. Such selection of the input causes variation in the input response characteristics of the output of the second internal column address strobe signal generator, thus providing a desired response appropriate for the selected mode or modes.

11 Claims, 22 Drawing Figures

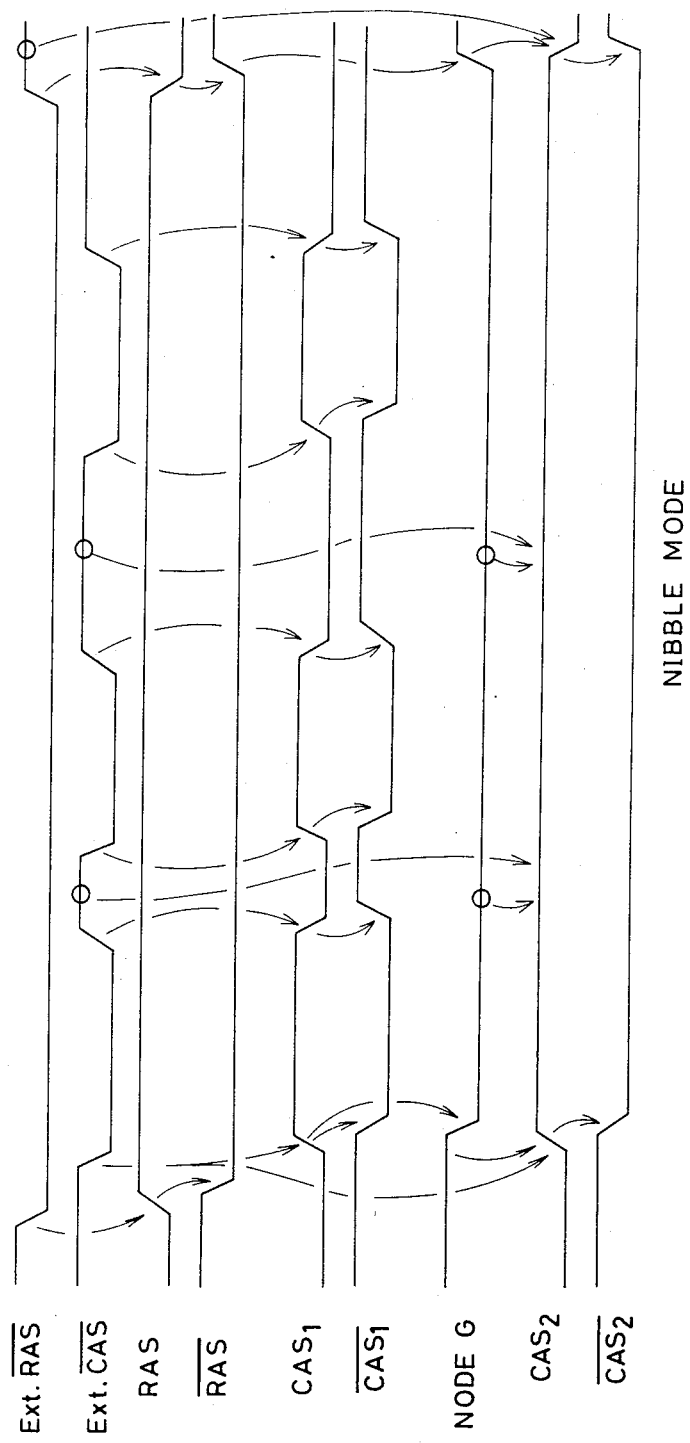

FIG. 16
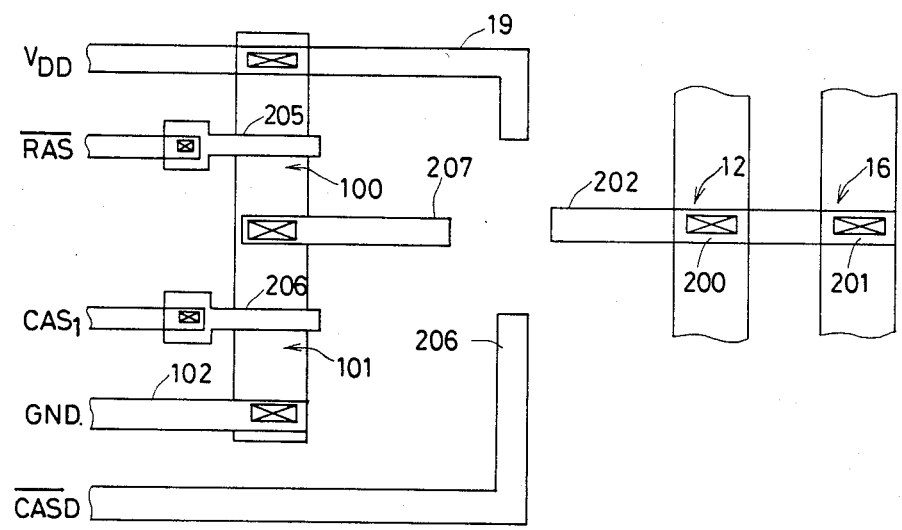
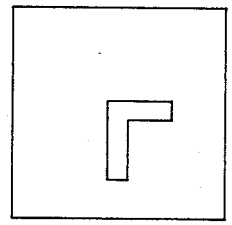
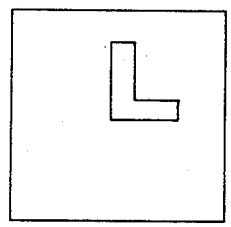
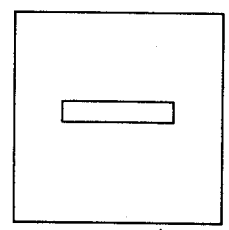
FIG. 17(a)   FIG. 17(b)   FIG. 17(c)

SEMICONDUCTOR MEMORY DEVICE

BACKGROUND OF THE INVENTION

1. Field of the Invention

This invention relates to a semiconductor memory device, and more particularly to a semiconductor dynamic random access memory device which only page mode, only nibble mode or both page mode and nibble mode is selectively obtained from a partially unconnected semiconductor memory device through alternations in a portion of wiring.

2. Description of the Prior Art

One of conventional ways to read out data in dynamic semiconductor memory devices is a so-called page mode. In this mode, one of word lines in a memory array is selected and then a desired one of digit lines is sequentially selected, whereby data are sequentially read out from memory cells at intersections of the selected word lines and digit lines. Referring to FIG. 1 which is a timing chart for operation events in this page mode, the mode will be discussed in detail.

(i) An external row address strobe signal (Ext.$\overline{RAS}$) applied to the semiconductor memory device from the external of the device becomes active "low" state, so that an internal row address strobe signal (Int. RAS, referred to as "RAS" hereinafter), or the output of an internal RAS buffer circuit changes from low to high. In response to this change, an internal row address is generated at address buffer circuit ($A_0$-$A_i$), and one of word lines corresponding to the row address is selected.

(ii) An external column address strobe signal (Ext. $\overline{CAS}$) externally applied to the semiconductor memory device is placed into active "low" state, so that an internal column address strobe signal (Int. CAS, referred to as "CAS" hereinafter) or output of an internal CAS buffer circuit changes from low to high. In response to this change, an internal column address is generated at the address buffer circuits, and one of digit lines which corresponds to the column address is selected. At this stage of operation, the one of the word lines and the one of the digit lines are selected so that data are read out from a memory cell at the intersection of the two lines.

(iii) After that, Ext. $\overline{CAS}$ is brought into inactive "high" state while the row address is fixed low. Using the transition as a trigger, an internal $\overline{CAS}$ signal (Int. $\overline{CAS}$) outputted from the internal CAS buffer circuit changes from low to high. A column decoder and a data output circuit are reset in response to the change.

(iv) When Ext. $\overline{CAS}$ becomes low again, a column address different from the previous one is generated to select one of the digit lines corresponding to the new column address. Since the row address is not changed during these operation, data are read out from a memory cell at the intersection of the previously selected word line and currently selected digit line.

In the page mode, data stored in the memory cells which are connected to the selected word line can be sequentially read out by sequentially selecting the digit lines by means of column address.

Meanwhile, a new method of reading out data, called "nibble mode", has recently been suggested and studied for practical use. For example, this nibble mode is disclosed in Digest of Technical Papers, IEEE International Solid-State Circuits Conference, 1981, pp 84 by S. S. Sheffield et al. In the nibble mode, when one of row addresses and one of column addresses are specified, a nibble or 4 bits of data are read out from a memory array. Referring to FIG. 2 showing a timing chart of the operation in the nibble mode and FIG. 3 showing an example of a circuit formed on a 64K bit dynamic RAM for the nibble mode, data reading operation in the nibble mode will be discussed in detail.

(i) Ext. $\overline{RAS}$ is brought into active "low" state so that the internal RAS buffer circuit RB becomes operable to change its output Int. RAS from low to high. In response to this transition, address buffer circuits ($A_0$-$A_7$) become operable to generate a row address signal which in turn is applied to a row decoder RD which decodes the row address signal to select one of 256 word lines ($WL_0$-$WL_{255}$).

(ii) Ext. $\overline{CAS}$ then changes to low. In response to this transition, the internal CAS buffer circuit CB becomes operable to change its output CAS from low to high. The address buffer circuits ($A_0$-$A_7$) become operable in response to such transition to generate a column address signal. Out of the outputs of the address buffer circuits, the outputs of $A_0$-$A_5$ are fed to a column decoder CD which decodes the signal to select four of 256 digit lines. Data are read out from four memory cells MC at the intersections of the one of the word lines selected in (i) above and these four digit lines. The 4 bit data are loaded into data registers ($DR_1$-$DR_4$) by way of four pairs of I/O lines ($I/O_1$-$I/O_4$), respectively. The remaining outputs of the address buffer circuits $A_6$ and $A_7$ are fed to data select shift registers ($DS_1$-$DS_4$) These 2 bits select and activate one of the data select registers ($DS_1$-$DS_4$), rendering conductive one of four switches ($SW_1$-$SW_4$) connected to the activated one of the data select registers. The data stored in the data register connected to the switch in such conductive state are outputted through an output buffer circuit OB.

(iii) An indicated in FIG. 2, Ext. $\overline{CAS}$ changes to high and then to low while Ext. RAS is held low. In response to the output of the CAS buffer circuit the shift register becomes operable and the switch previously in conductive state becomes nonconductive. The next switch then becomes conductive so that data stored in the data register connected to that newly conductive switch are delivered through the output buffer circuit OB. For example, assuming that $SW_1$ is initially selected and rendered conductive by the outputs of $A_6$ and $A_7$, the shift register advances one step through the this procedure and $SW_1$ becomes nonconductive and $SW_2$ conductive.

In this manner, the shift registers ($DS_1$-$DS_4$) are operated by changing Ext. $\overline{CAS}$ in the order of high→low high→low while Ext. $\overline{RAS}$ is held low, whereby data in the data registers ($DR_1$-$DR_4$) are sequentially read out. The column address need be given at the first step but not every step. In other words, since there is no need to give the column addresses from time to time in the nibble mode unlike the page mode, operation of the internal CAS buffer circuit CB and the address buffer circuits ($A_0$-$A_7$) is not necessary from time to time. The nibble mode allows high speed data reading as compared with the page mode. The nibble mode is however disadvantageous in that only 4 bits of data as selected by the column address at the first step may be read out.

In other words, the page mode and the nibble mode have the inherent advantages and disadvantages, respectively, and it is very convenient if the semiconductor memory device is selectively operable in the page mode or the nibble mode. Although the page mode and the nibble mode are totally different in operational mode in the semiconductor memory device, it is noted from FIGS. 1 and 2 that the timing relationship between Ext. RAS and Ext. CAS in both the modes is completely identical. With the conventional semiconductor memory device, selective use of the two modes is impossible and only one of the two modes is available.

To overcome the above problem, the inventors of the present invention have suggested a new semiconductor memory device which is operable in a selected one of page mode and nibble mode, depending upon whether the length of time in which Ext. CAS is high is longer than a predetermined length of time. This semiconductor memory device is set forth in our copending application and should not be considered as the prior art device. For convenience of explanation only, an overview of the semiconductor memory device will be given below.

In the semiconductor memory device in which both the page mode and the nibble mode are selectively available, there is provided a circuit for discriminating the length of time in which Ext. $\overline{CAS}$ is in inactive state with the predetermined length of time, while Ext. $\overline{RAS}$ is in active state. By varying the length of time where Ext. $\overline{CAS}$ is in inactive state, the page mode and the nibble mode are optionally selectable while Ext. $\overline{RAS}$ is in active state. Detailed structure and operation of the device will be described later in connection with the present invention.

There are therefore three types of semiconductor memory devices: one operable only in the page mode, one operable only in the nibble mode and one operable selectively in the page mode or the nibble mode. In no event shall only one of the three types of the semiconductor devices be used as the best one. In other word, selection of the types is left to the user's choice.

However, design and manufacture of respective ones of the three types of semiconductor memory devices result in labor expenditures on the part of the supplier and increases in supply costs of the semiconductor memory devices. It is therefore desirable that those devices be manufactured through a lot of common manufacturing steps.

SUMMARY OF THE INVENTION

It is the primary object of the present invention to provide a semiconductor memory device which is one of three types of semiconductor memory devices to be obtained from a partially unconnected semiconductor memory device through alternations in a portion of wiring; one operable only in page mode, one operable only in nibble mode and one operable selectively in page mode or nibble mode.

It is another object of the present invention to provide a semiconductor memory device which is given three choices through labor-saving manufacture.

It is still another object of the present invention to provide a semiconductor memory device which is given three choices through inexpensive manufacture.

To achieve the above objects, the present invention provides a semiconductor memory device with a memory array storing data, said data being read out in response to an external row address strobe signal and an external column address strobe signal, said semiconductor memory device comprising internal row addresses strobe signal generator means, first internal column address strobe signal generator means, delay means and second internal column address strobe signal generator means. The second internal column address strobe signal generator means include a constant voltage source, circuit means for providing an output changing from one level to another level when the external row address strobe signal is brought to inactive and changing from said another level to said one level when the external column address strobe signal is brought to active state, and first NAND gate means provided at the first stage of the second internal column address strobe signal generator means. Furthermore, the second internal column address strobe signal generator means include connection means for connecting one selected from the output of the delay means, the output of said constant voltage source and the output of said circuit means to an input terminal of the first NAND gate means. The semiconductor device further comprises data address signal generator means, data read out means and output means.

The major advantage of the present invention as described briefly above is provision of a semiconductor memory device which is one of three types of semiconductor devices obtained from a partially unconnected semiconductor memory device through mere alternations in a portion of wiring: one operable only in page mode, one operable only in nibble mode and one operable selectively in page mode or nibble mode.

Another advantage of the present invention is the capability to provide the above three types of semiconductor devices through labor-saving manufacture.

Still another advantage of the present invention is the capability to provide the above three types of semiconductor devices through inexpensive manufacture.

In an embodiment of the present invention, the portion of wiring is formed through the step of aluminum wiring using a mask.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a timing chart showing operation timing of a semiconductor memory device using CB$_2$ of FIG. 14; and FIGS. 16, 17A, 17B, 17C, 18A, 18B, and 18C are diagrams showing manufacturing steps of the semiconductor memory device according to the embodiment of the present invention.

DESCRIPTION OF THE PREFERRED EMBODIMENTS

Figure 4:
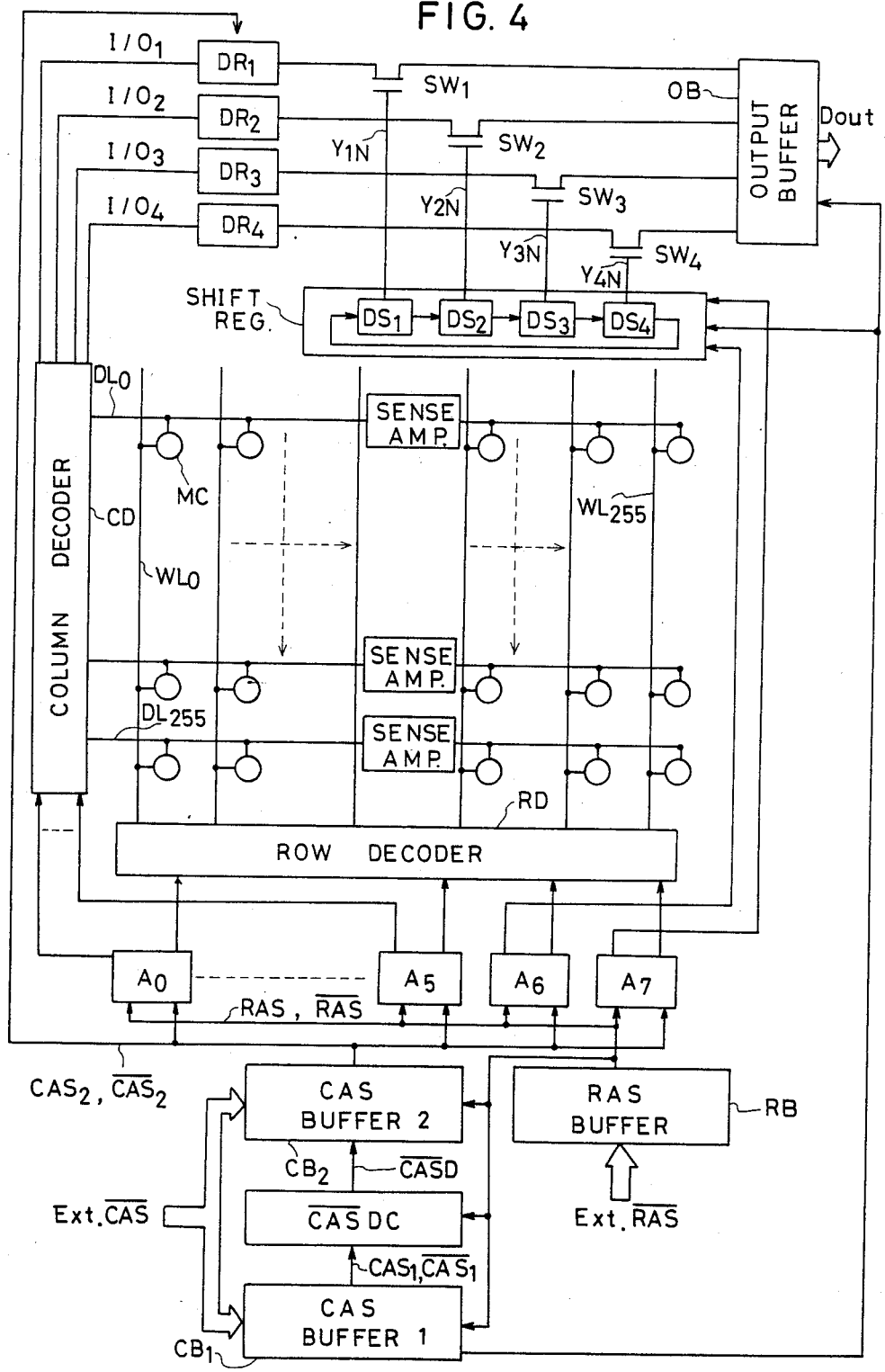
FIG. 4 is a block diagram of a semiconductor memory device according to an embodiment of the present invention.

FIG. 4 is a block diagram of a semiconductor memory device according to the embodiment of the present invention. This device may be formed on a single semiconductor chip, especially on a single 64K dynamic RAM chip.

The constitutional elements of the memory device and interconnections therebetween will now be discussed. In FIG. 4, memory cells MC are arranged to form a memory array especially a square array of 256 ($=2^8$) high $\times$ 256 ($=2^8$) wide. There are disposed over the memory array 256 word lines (WL$_0$–WL$_{255}$) in a vertical direction and 256 digit lines (DL$_0$–DL$_{255}$) in a horizontal direction. Each of the memory cells is disposed at the intersection of one of the word lines and one of the digit line. Each of the digit lines has a sense amplifier at the middle thereof for amplification of signals read out. Each of the word lines is connected to a row decoder RD, while each of the digit lines is connected to a column decoder CD. The outputs of the column decoder are fed to four data registers (DR$_1$–DR$_4$) by way of four input/output lines (I/O$_1$–I/O$_4$) and the outputs of the four data registers are led to an output buffer circuit OB through conductive paths of switches (SW$_1$–SW$_4$), respectively.

The outputs of the semiconductor device are obtainable through the output buffer circuit OB. The respective gates of the switches SW$_1$–SW$_4$ are connected to four data select registers (DS$_1$–DS$_4$) disposed in a shift register SR. An external column address strobe signal Ext. $\overline{CAS}$ for the memory array is supplied to the first CAS buffer circuit CB$_1$ and the second CAS buffer circuit CB$_2$. The output of the first CAS buffer circuit CB$_1$ is supplied to the $\overline{CASD}$ generator $\overline{CASDC}$, the shift register SR and the output buffer circuit OB. The output of the $\overline{CASD}$ generator $\overline{CASDC}$ is fed to the second CAS buffer circuit CB$_2$. The output of the second CAS buffer circuit CB$_2$ is divided and supplied respectively to address buffer circuits A$_0$–A$_7$ and the data registers DR$_1$–DR$_4$.

An external row address strobe signal Ext. $\overline{RAS}$ for the memory array, on the other hand, is fed to an RAS buffer circuit RB the output of which is supplied to the address buffer circuits A$_0$–A$_7$, the first and second CAS buffer circuits CB$_1$ and CB$_2$ and the $\overline{CASD}$ generator $\overline{CASDC}$. Row address signal outputs from the address buffer circuits A$_0$–A$_7$ are applied to the row decoder. The column address signal outputs from the address buffer circuits A$_0$–A$_5$ are fed to the column decoder, while the output signals from the address buffer circuits A$_6$ and A$_7$ are fed to the data select registers DS$_1$–DS$_4$ in the shift register SR.

Detailed circuit arrangements of the characteristic components of the semiconductor memory device of FIG. 4 will be discussed.

FIRST CAS BUFFER CIRCUIT (CB$_1$)

Figure 1:
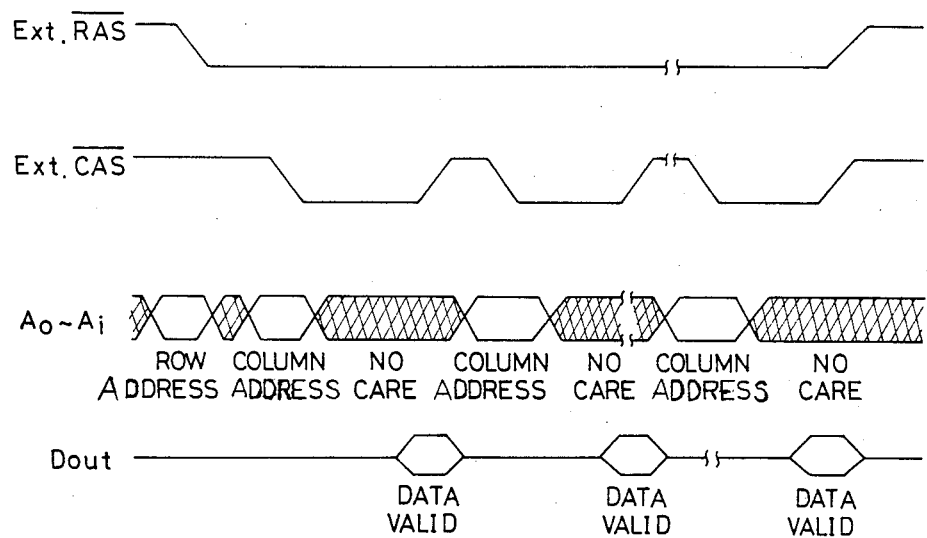
FIG. 1 is a timing chart showing timing relationship of a page mode in a conventional semiconductor memory device.
Figure 2:
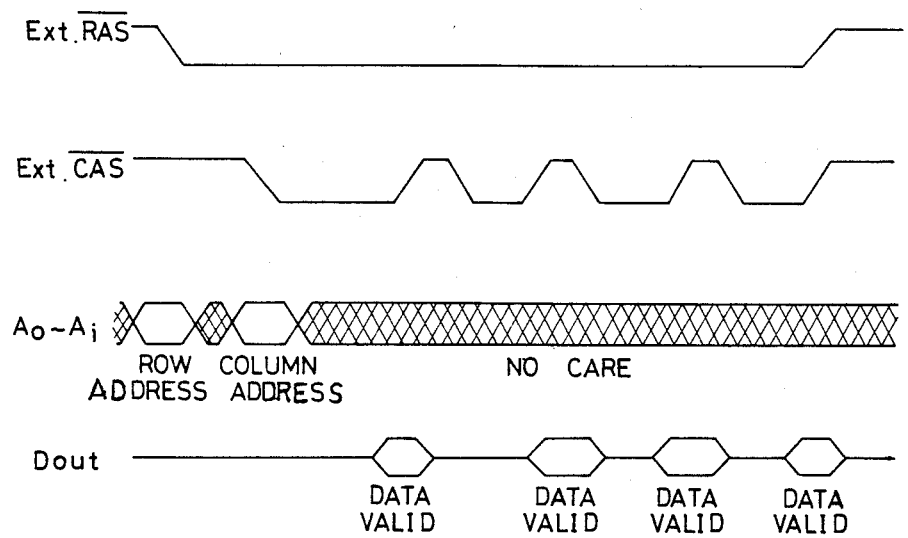
FIG. 2 is a timing chart showing timing relationship of a nibble mode in a conventional semiconductor memory device.
Figure 3:
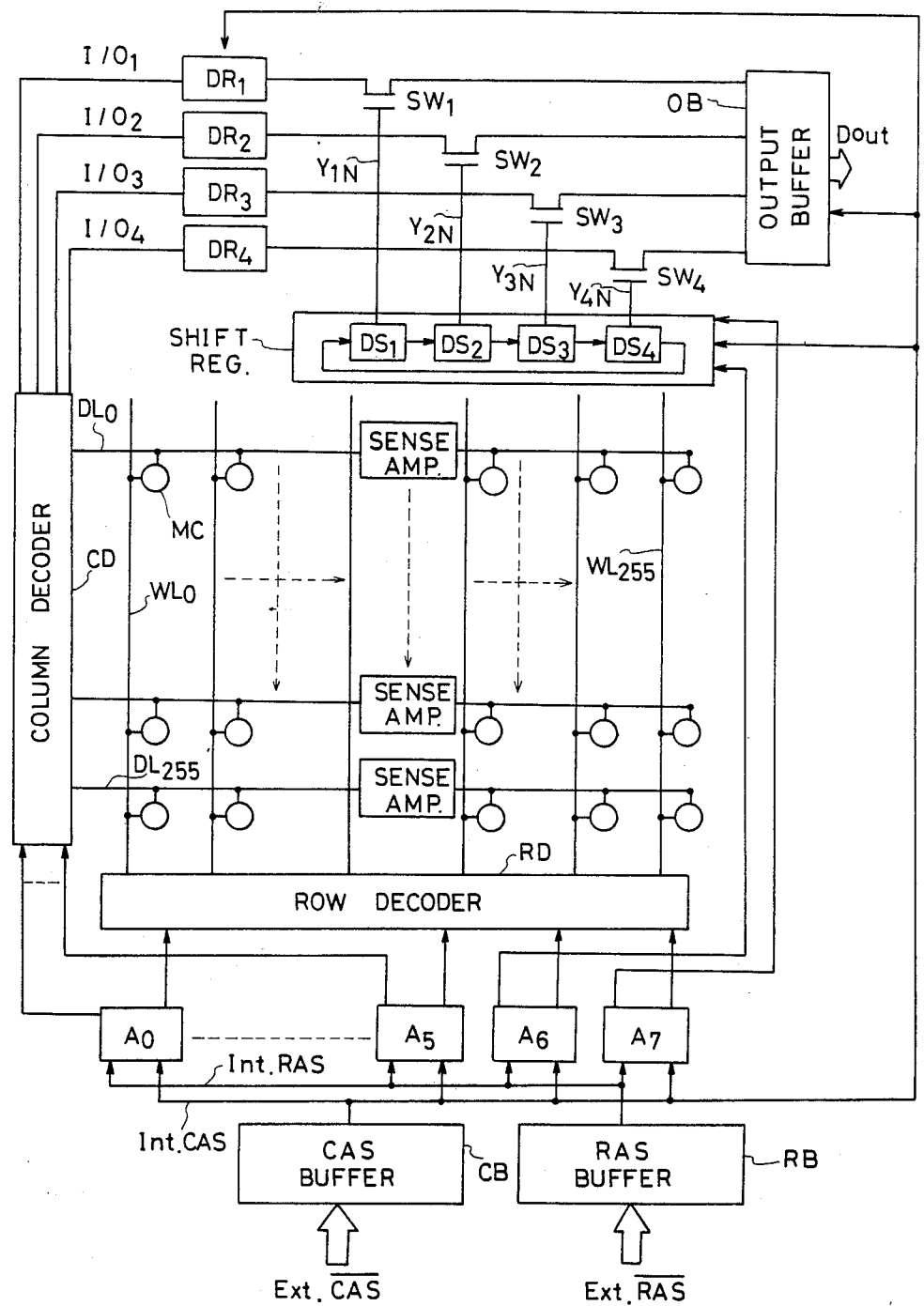
FIG. 3 is a block diagram of a conventional semiconductor memory device wherein the nibble mode is available.
Figure 5:
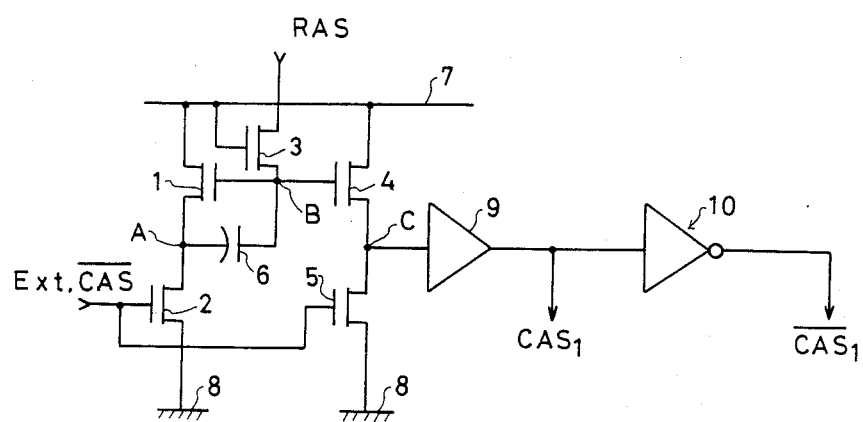
FIG. 5 is a block diagram of a first CAS buffer circuit in the device of FIG. 4.

The first CAS buffer circuit CB$_1$ is designed to receive Ext. $\overline{CAS}$ signal and generate a first internal column address strobe signal (CAS$_1$) and its inverted signal ($\overline{CAS}_1$). The first CAS buffer circuit CB$_1$ may be of the same structure as that of the conventional CAS buffer circuit (CB in FIG. 3) and is typically configured as shown in FIG. 5. In FIG. 5, CB$_1$ comprises N channel MOS transistors (referred to as "MOST" hereinafter) 1–5. CB$_1$ further includes a bootstrap capacitance 6, a source line 7, a grounding terminal 8, an amplifier 9 and an inverter 10. The circuit elements as shown in FIG. 5 are those necessary for explanation of the present invention and those unnecessary therefore are omitted in FIG. 5. The outputs CAS$_1$ and $\overline{CAS}_1$ of CB$_1$ are supplied to the $\overline{CASD}$ generator and also used for controlling the shift registers DS$_1$–DS$_4$ and the output buffer circuit OB.

$\overline{CASD}$ GENERATOR ($\overline{CASDC}$)

Figures 6, 7, 9:
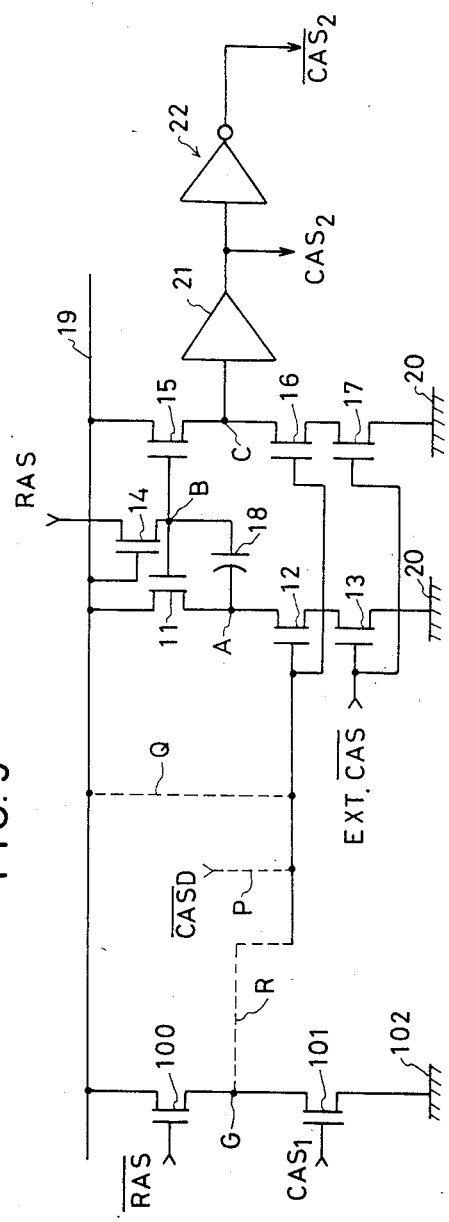
FIGS. 6, 7 and 8 are block diagrams showing a typical example of a $\overline{CASD}$ generator in the device of FIG. 4.
FIG. 9 is a block diagram of a second CAS buffer circuit in the device of FIG. 4, in which full connections are not yet effected.
Figure 8:
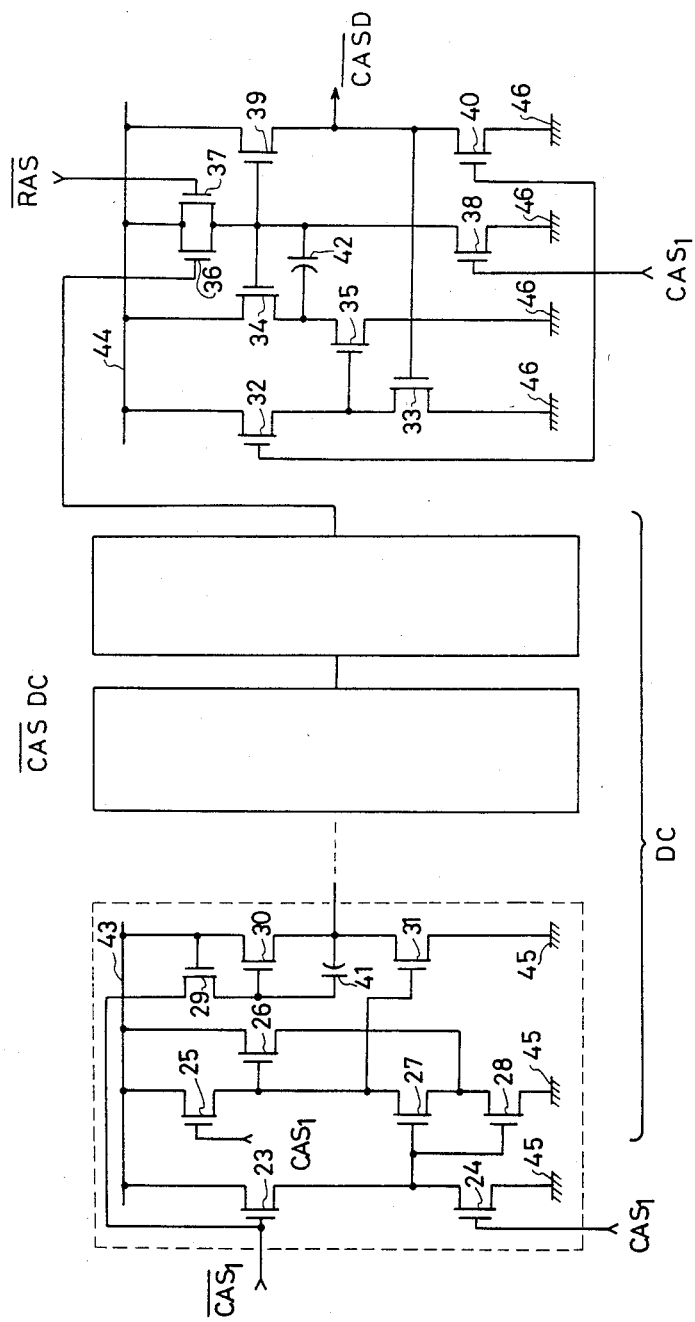

The $\overline{CASD}$ generator ($\overline{CASDC}$) is a circuit which receives the output CAS$_1$ of CB$_1$ and delivers the same after proper processing including time delay of that output. Block diagrams of $\overline{CASDC}$ are illustrated in FIGS. 6 and 7 and its typical configuration in FIG. 8. Referring to FIG. 6, $\overline{CASDC}$ comprises a delay circuit DC for delaying $\overline{CAS}_1$ received and a logical sum circuit OR for evaluating the logical sum of the output of the delay circuit DC and the output $\overline{RAS}$ of the RAS buffer circuit and providing the output $\overline{CASD}$ thereof representative of the sum. The delay circuit, as also illustrated in FIG. 7, comprises a serial connection of a prodetermined number of inverter stages INV. In FIG. 8 illustrating a detailed configuration of the $\overline{CASD}$ generator, the inverter stages are represented by the dot line or solid line. Each of the inverters comprises MOST's 23–31, a bootstrap capacitance 41, a source line 43 and grounding terminals 45. The final stage of $\overline{CASD}$ is the OR gate circuit which comprises MOST's 32–40, a bootstrap capacitance 42, a source line 44 and grounding terminals 46. It is noted that the output of signal of DC drops to a low level without any substantial delay when $\overline{CAS}_1$ drops to a low level, and rises to a high level with a delay time (t) when $\overline{CAS}_1$ rises to high.

SECOND CAS BUFFER CIRCUIT (CB$_2$)

The second CAS buffer circuit CB$_2$ is a circuit to generate a second internal column address strobe signal (CAS$_2$) and its inverted signal ($\overline{CAS}_2$).

A typical example of the second CAS buffer circuit CB$_2$ in FIG. 4 is illustrated in FIG. 9 in which full connections are not yet effected. CB$_2$ comprises MOST's 11–17, 100 and 101, a bootstrap capacitance 18, a source line 19, grounding terminals 20 and 102, an amplifier 21 and an inverter 22. In FIG. 9, one of connections as denoted by the dot line is actually selected later.

The first stage of CB$_2$ is a NAND gate which receives as its inputs Ext. $\overline{CAS}$ and one signal obtained from a selective connection and includes a pair of MOST's 12 and 13 and a pair of MOST's 16 and 17. Out of the output signals of CB$_2$, CAS$_2$ is used for controlling generation of column addresses, startup of the data registers and so forth and CAS₂ is used for controlling resetting of the column decoder and the data registers and so forth.

Next, operation of the semiconductor device of FIG. 4 including the above described circuits will be discussed by reference to output waveforms developing at respective points in the circuits.

Figure 10:
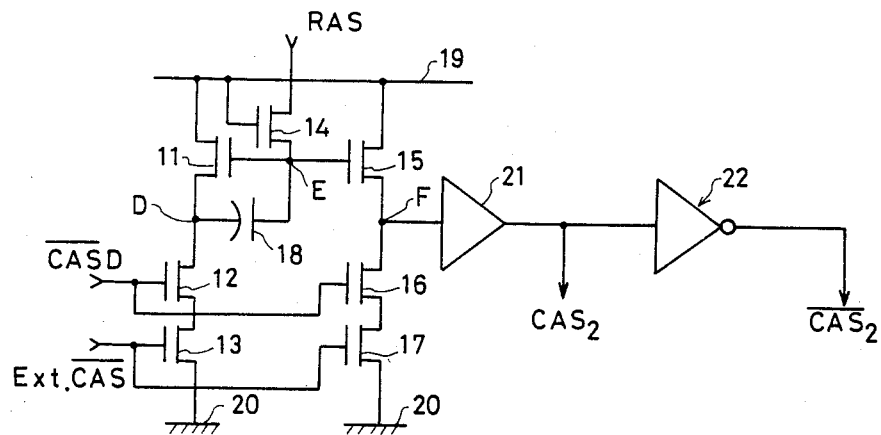
FIG. 10 is a circuit diagram of CB$_2$ in a semiconductor memory device in which both page mode and nibble mode are selectively available.
Figure 11:
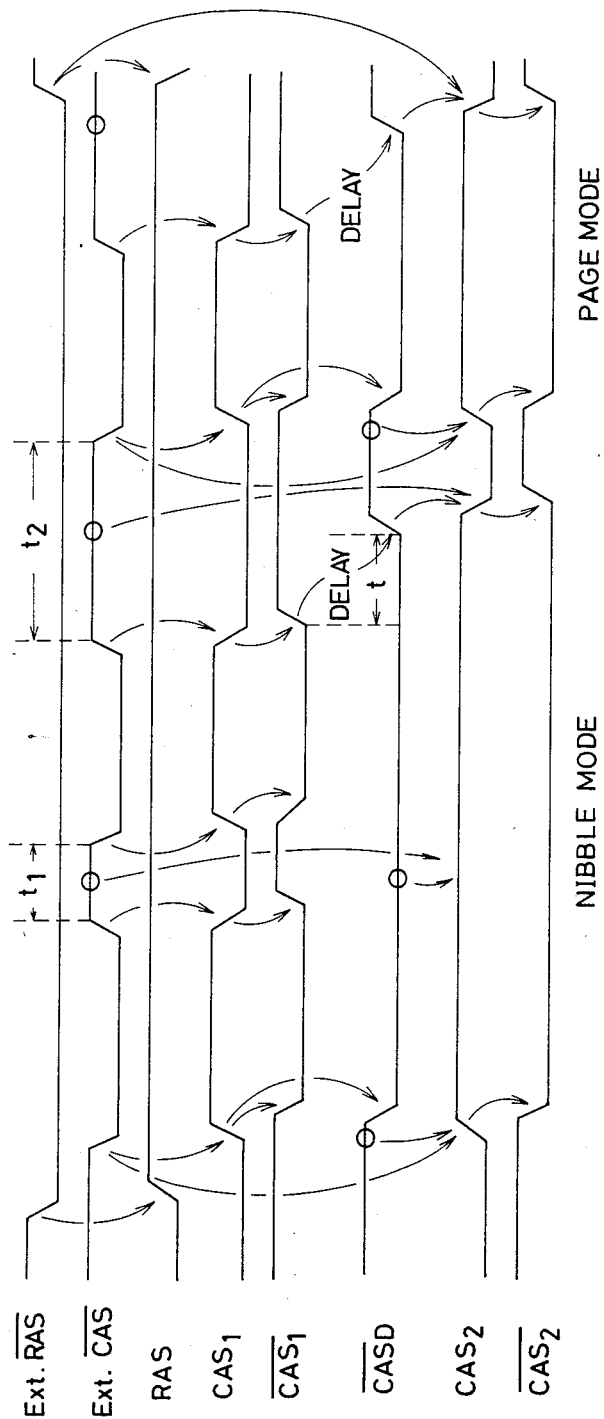
FIG. 11 is a timing chart showing operation timing of a semiconductor device using CB$_2$ in FIG. 10.

(I) Assume now that connection P is selected. $\overline{CASD}$ is supplied to the gates of the respective MOST's 12 and 16. Structure of CB₂ when this connection is selected is illustrated in FIG. 10. In the following description, reference is always made to FIG. 11 which is a timing chart showing timing relationships among those output waveforms. In FIG. 11, the arrows represent signals which trigger subsequent events in a sequence of operation.

(i) The external row address strobe signal Ext. $\overline{RAS}$ becomes active "low" state. The RAS buffer circuit RB receiving as its input the Ext. $\overline{RAS}$ is adapted to invert this input signal in synchronism with the same. When Ext. $\overline{RAS}$ changes to low, the output of RB, RAS rises up to a high level. This transition initiates operation of the address buffers $A_0$–$A_7$ and thus generation of the row address. The row address so generated is decoded through the row decoder RD to select one of the word lines. At the same time RAS is supplied to CB₁. Since the gate of MOST 3 is connected to the source line 7 and the MOST 3 is in ON-state, node B in CB₁ as shown in FIG. 5 is charged up to a high level so that the gates of MOST's 1 and 4 are brought to a high level. This implies that MOST's 1 and 4 are turned on. Since Ext. $\overline{CAS}$ has been high until the moment, MOST's 2 and 5 are held on. Provided that the ratio of MOST 1 to MOST 2 and that of MOST 4 to MOST 5 are selected to be sufficiently high, nodes A and C are at a low level. As a result, CAS₁ is low, $\overline{CAS_1}$ is high and CASD is high (see FIG. 6).

Because of Ext. $\overline{CAS}$ and $\overline{CASD}$ being high, $\overline{CAS_2}$ and CAS₂ available through the output of the NAND circuit in the circuit arrangement of FIG. 6 are low and high, respectively. No column address signal has not developed at this moment.

(ii) Then, Ext. $\overline{CAS}$ becomes active "low" state. MOST's 2 and 5 in the circuit arrangement of FIG. 5 are turned off so that nodes A and C are at a high level and CAS₁ changes to high and $\overline{CAS_1}$ changes to low. It is noted that CAS₁ is an inverted signal synchronous with Ext. $\overline{CAS}$ and $\overline{CAS_1}$ developing in response to CAS₁ is a signal synchronous with Ext. $\overline{CAS}$. Transition of $\overline{CAS_1}$ to a low level causes the output $\overline{CASD}$ of $\overline{CASDC}$ to drop to a low level. As stated previously, the output of the delay circuit DC drop without any delay at the downward edge of $\overline{CAS_1}$. Consequently, transition of $\overline{CASD}$ to a low level takes place substantially at the same time as the moment where $\overline{CAS_1}$ changes to low. Since the first stage of CB₂ is the NAND circuit receiving Ext. $\overline{CAS}$ and $\overline{CASD}$, the output CAS₂ of CB₂ changes to high, while $\overline{CAS_2}$ changes to low. As is clear from the circuit arrangement of FIG. 6, this transition is determined by the time where $\overline{CASD}$ or Ext. $\overline{CAS}$ changes to low first. Since CAS₁ changes to high in response to change of Ext. $\overline{CAS}$ to a low level and $\overline{CASD}$ changes to low in response to change of CAS₁ to a high level, it is understood that Ext. $\overline{CAS}$ always changes to low earlier. The building-up edge of CAS₂ is therefore determined by Ext. $\overline{CAS}$ at all times. When CAS₂ changes to high, the address registers $A_0$–$A_7$ becomes operable to generate a particular column address. Out of the column address signals, the signals from $A_0$–$A_5$ are decoded in the column decoder to select one of the digit lines. By selecting the one of the word lines and the one of the digit lines, 4 bits of data are loaded into the data registers (DR₁–DR₄) by way of the I/O lines (I/O₁–I/O₄). The remaining 2-bit column address outputs from the address registers A₆ and A₇ are fed to the shift register SR, which selects one of the data select registers (DS₁–DS₄) in response thereto. This results in that one of the switches (SW₁–SW₄) becomes conductive and data in the data register connected to that switch in conductive state are outputted via the output buffer OB.

(iii) Ext. $\overline{CAS}$ changes to high while Ext. $\overline{RAS}$ is held low. Then, CAS₁ changes to low and $\overline{CAS_1}$ changes to high. However, since the delay circuit DC for $\overline{CASD}$ is intended to provide a high level, output with the delay time t after $\overline{CAS_1}$ changes to high, $\overline{CASD}$ is held low for the delay time t. If Ext. CAS changes to low again during the delay time t, then CAS₁ changes to high and $\overline{CAS_1}$ changes to low, respectively. $\overline{CAS_1}$, therefore, changes to low before $\overline{CASD}$ changes to high, and $\overline{CASD}$ loses an opportunity of changing to high (it is recalled that the delay circuit DC does not provide any delay time at the downward edge of $\overline{CAS_1}$) In the case where the time t₁ where Ext. $\overline{CAS}$ is high is correlated as t₁ < t, there is not change in $\overline{CASD}$ and thus CAS₂ and $\overline{CAS_2}$. This suggests that no new address is established at the address registers $A_0$–$A_7$ and that the data registers and the column decoder are not reset. However, since CAS₁ changes during that period, the shift register performs shift operation so that data in the next succeeding data register are outputted through the output buffer. In other words, the nibble mode comes into effect.

Unless Ext. $\overline{CAS}$ changes to low during the period t, that is, where the period of time t₂ in which Ext. $\overline{CAS}$ stands high is correlated as t₂ > t, $\overline{CASD}$ changes to high once. At time CAS₂ changes to low and $\overline{CAS_2}$ changes to high, resetting the data registers DR₁–DR₂, the column decoder CD, the address buffer circuit and so forth. When Ext. $\overline{CAS}$ then changes to low, a new column address is developed through the operation in (ii) above to start up the data register. In other words, the event which follows is startup of the page mode.

In brief, should the period of time in which Ext. $\overline{CAS}$ is high be shorter than the delay time t at the building-up edge of $\overline{CASDC}$, the previous column address is maintained and data are sequentially read out from the data register. The nibble mode will follow. However, should said period be longer than the building-up delay time t, a new column address is developed and the page mode comes into effect.

(iv) Ext. $\overline{CAS}$ changes to high and low repeatedly while Ext. $\overline{RAS}$ is held low. Through proper selection of the period of time in which Ext. $\overline{CAS}$ is high, the nibble mode and the page mode are optionally selectable. Ext. $\overline{CAS}$ may change to low a desired number of times while Ext. $\overline{RAS}$ is held low. Whenever Ext. $\overline{CAS}$ changes to low, data are outputted one by one, the output mode thereof being determined by the length of time in which Ext. $\overline{CAS}$ is high.

(v) Ext. $\overline{RAS}$ changes to high. RAS changes to high in synchronism with such change, resetting all of the circuits. When this occurs, $\overline{CASD}$ changes to high without delay so that $\overline{CAS_1}$ also changes to high without delay. High speed resetting is therefore possible.

In other words, through selection of connection P a semiconductor memory device is available which is operable selectively in the page mode or the nibble mode.

Figure 12:
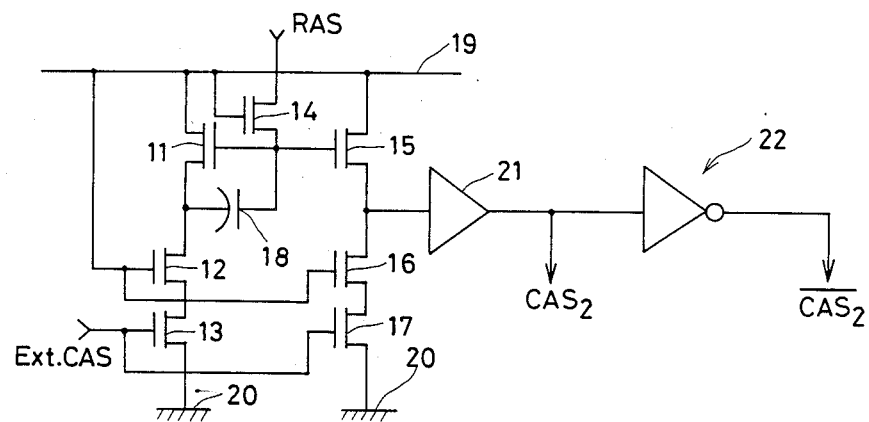
FIG. 12 is a circuit diagram of CB$_2$ in a semiconductor memory device in which only page mode is available.
Figure 13:
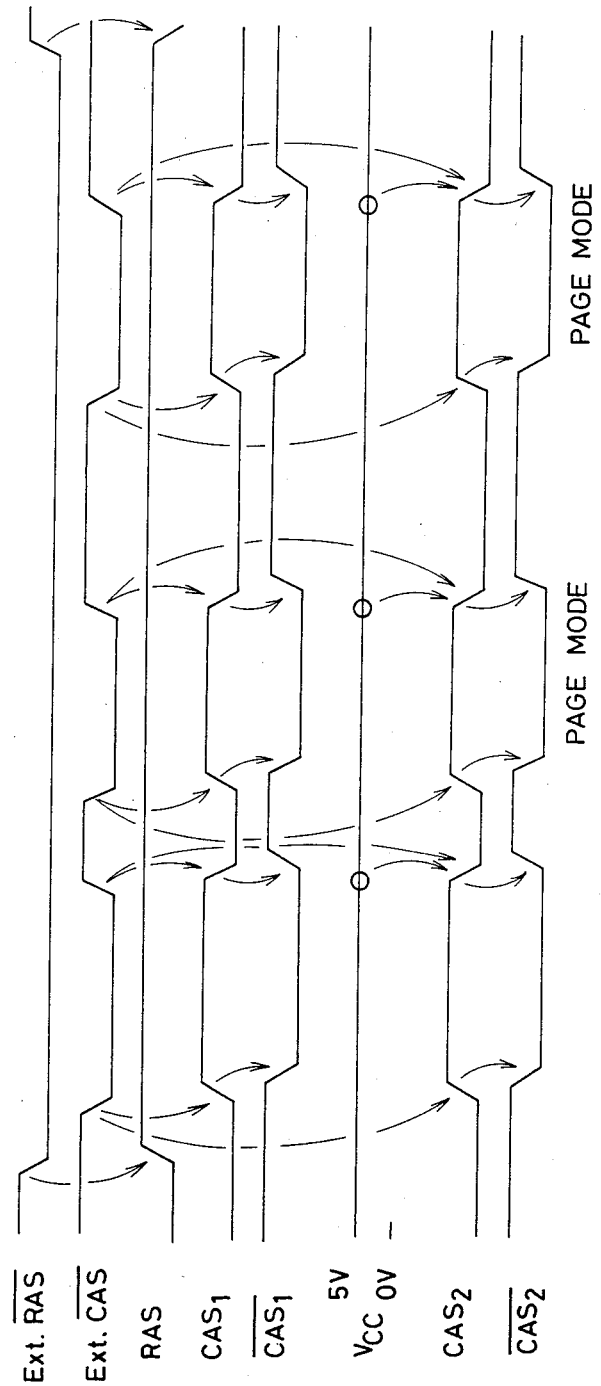
FIG. 13 is a timing chart showing operation timing of a semiconductor memory device using CB$_2$ of FIG. 12.

(II) Assume then that connection Q is selected. The gates of the MOST's 12 and 16 are connected to the source line 19. Structure of $CB_2$ when this connection is selected is illustrated in FIG. 12, in which the MOST's 12 and 16 are constantially conductive. The building-up and downward edges of $CAS_2$ are therefore controlled by only ON-OFF stage of the MOST's 13 and 17. $CAS_2$ and $\overline{CAS_2}$ are signals synchronous with Ext. $\overline{CAS}$. This situation may be confirmed by a timing chart of FIG. 13 wherein the time relationship of Ext. $\overline{CAS}$ changing to high and low repeatedly is conveyed to $CAS_2$. In this case $CAS_2$ is a signal identical with $CAS_1$. The shift registers $DS_1$–$DS_4$ and the output buffer circuit OB under control of $CAS_1$ and the data registers $DR_1$–$DR_4$, the column decoder CD, the address buffer circuit and so forth under control of $CAS_2$ are all perform operation and resetting repeatedly in synchronism with Ext. $\overline{CAS}$, whereby only the page mode is made available.

Figure 14:
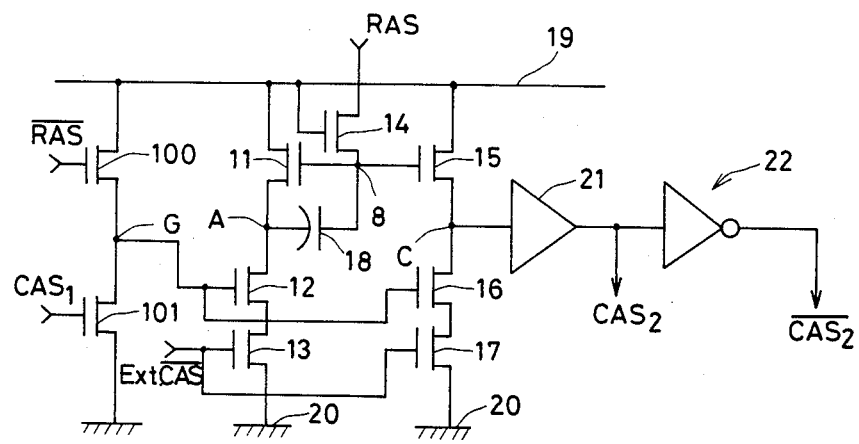
FIG. 14 is a circuit diagram of CB$_2$ in a semiconductor memory device in which only nibble mode is available.

(III) Furthermore, assume that connection R is selected. The gates of the respective MOST's 12 and 16 are connected to an output node G of the circuit comprising the MOST's 100 and 101. Structure of $CB_2$ when this connection is selected is illustrated in FIG. 14. Operation will be discussed with reference to FIG. 15 showing a timing chart in this case. $\overline{RAS}$ applied to the gate of MOST 100 is an in-phase signal synchronous with Ext. $\overline{RAS}$, as generated from the RAS buffer circuit RB. Furthermore, $CAS_1$ applied to the gate of MOST 101 is a 180° out-of-phase signal synchronous with Ext. $\overline{CAS}$, as generated from the first CAS buffer circuit $CB_1$. The node G, as seen in FIG. 15, is precharged through MOST 100. When $CAS_1$ changes from low to high, MOST 101 is turned on, bringing node G to a low level. As long as Ext. $\overline{RAS}$ is low, node G is held at the low level whether Ext. $\overline{CAS}$ is low or high. Only when Ext. $\overline{RAS}$ changes from low to high, MOST 100 is turned on, pre-charging node G up to a high level. The gate of MOST 12 is supplied with the output from node G and the gate of MOST 13 with Ext. $\overline{CAS}$. The MOST's 12 and 13 and the MOST's 16 and 17 set up NAND gates, respectively. Therefore, the moment where the output $CAS_2$ of the second CAS buffer circuit $CB_2$ rises from low to high is determined by the moment where either of the MOST's 12 and 13 is turned off. In other words, $CAS_2$ changes to high at the earlier of the moment where the output of node G changes to low and that where Ext. $\overline{CAS}$ changes to low. The device is however arranged such that the output of node G changes to low in response to $CAS_1$ changing to high and $CAS_1$ changes to high in response to Ext. $\overline{CAS}$ changing to low. Therefore, Ext. $\overline{CAS}$ changes to low earlier than the output of node G does. The building-up time of $CAS_2$ is constantly determined by the moment where Ext. $\overline{CAS}$ changes to low. On other other hand, the moment where $CAS_2$ changes to low is coincident with the moment where both the MOST's 12 and 13 are turned on, that is, the moment where both Ext. $\overline{CAS}$ and the output of node G are at a high level. As long as Ext. $\overline{RAS}$ is low, the output of node G keeps low. The moment where $CAS_2$ changes to low is coincident with the movement where the output of node G changes to high, i.e. the moment where Ext. $\overline{RAS}$ changes to high. The downward edge of $CAS_2$ is controlled by Ext. $\overline{RAS}$, independently of Ext. $\overline{CAS}$. As is well understood from the foregoing operation, as long as Ext. $\overline{RAS}$ is low, the column decoder CD and the data registers $DR_1$–$DR_4$ under control of $CAS_2$ and its associated signals are held in its original state in spite of whether Ext. $\overline{CAS}$ changes from low to high repeatedly. The semiconductor memory device using $CB_2$ in FIG. 14 is operable only in the nibble mode.

As noted earlier, the page mode, the nibble mode and both the page mode and the nibble mode are optionally selectable by selection of one of the three connections in the second CAS buffer circuit as shown in FIG. 9.

An example of manufacture of the semiconductor memory device according to the present invention will be discussed. P type and N type impurities are selectively diffused over a silicon substrate to define elements necessary in the circuit of FIG. 4. This step is well known in the art and readily executable by those skilled in the art. Aluminum wiring is deposited over the substrate, using a mask. While this step is also well known, portion of this wiring step is altered from the conventional one for the purpose of the embodiment of the present invention. Such alternations are best shown in FIG. 16 and reference to FIG. 9 is required. In FIG. 16, regions 200 and 201 corresponding to the gate electrodes of the MOST's 12 and 16 are interconnected to form an open end 202. RAS wiring is connected to the gate electrode 205 of a MOST 100 and $CAS_1$ wiring is connected to the gate electrode 206 of a MOST 101. The source lead 19 having an open end is connected to one end of a series combination of the MOST's 100 and 101 and a grounding line 102 is connected to the other end thereof. Furthermore, CASD wiring 206 extends in the proximity of those MOST's so as to form an open end.

Disposed between the gate electrodes 205 and 206 is a wiring 207 having an open end. Though the wiring 202 is to be connected to any one of the wirings 19, 207 and 206, it is left with an open end at this stage of manufacture.

Figure 18A:
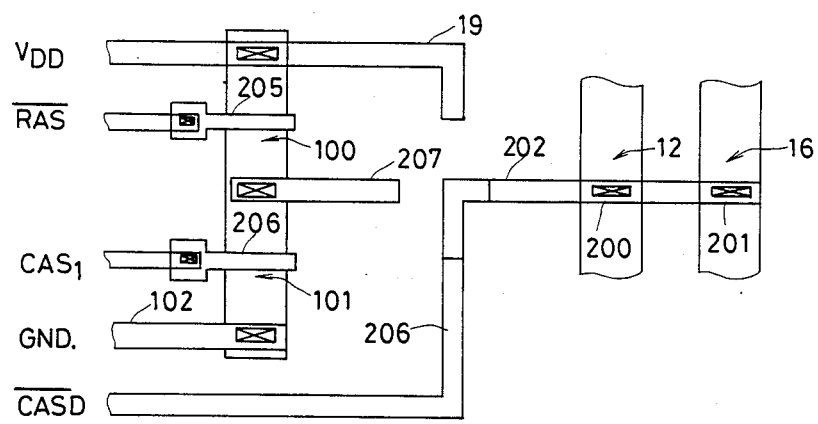
Figure 18B:
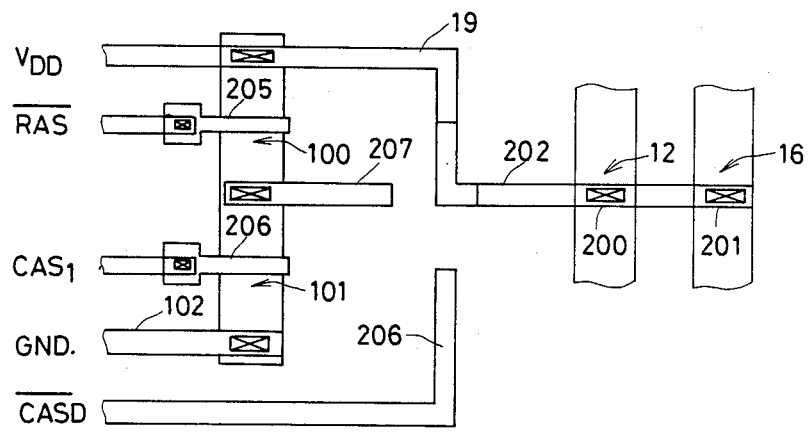
Figure 18C:
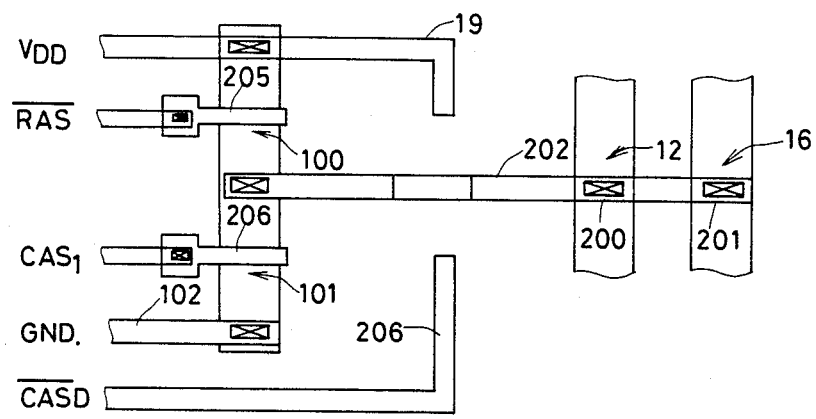

Depending on whether the semiconductor memory device should be operable only in the page mode, or only in the nibble mode or selectively operable in the page mode or the nibble mode, a second step of aluminum wiring is performed. In other words, wiring is carried out separately through the use of one of masks as depicted in FIG. 17. For example, when the mask in FIG. 17(a) is used for aluminum wiring, interconnections as show in FIG. 18(a) are provided so that $CB_2$ in FIG. 10 is completed. When the masks in FIGS. 17(b) and 17(c) are used, $CB_2$ patterns as in FIGS. 18(b) and 18(c) are formed to correspond to $CB_2$ in FIGS. 12 and 14, respectively. It is desirable that the respective electrodes in FIG. 16 be disposed very closely to one another to shorten the length of the second aluminum wiring structure.

Whereas in the above embodiment one of the inputs to the NAND gate at the first stage of the second CAS buffer circuit permitting only the page mode to be available is the source voltage $V_{DD}$, this voltage may be substituted by any voltage which exceeds the threshold voltage of the MOST's. Furthermore, the signal applied to the NAND gate in the $CB_2$ circuit arrangement permitting only the nibble mode to be available may be any signal obtainable from a circuit arrangement which provides an output changing to high in response to Ext. $\overline{CAS}$ changing to high, and changing to low in response to the output CAS₁ of the first CAS buffer circuit changing to high.

The circuit are built up by the N channel MOS transistors in the foregoing embodiment but they may be set up by P channel transistors, CMOS transistors, bipolar transistors, etc. The second CAS buffer circuit has only to include at the first stage thereof the NAND logic circuit receiving the output of the delay circuit and Ext. CAS and should not be limited to the foregoing embodiment. If data simultaneously read out from the memory array are of N bits in the present invention, then all that is necessary to do is to supply the shift register with outputs of M bits out of all of the outputs from the address buffers, where N, M are integer and $2^M = N$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device with a memory array for storing data, said data being read out in response to an external row address strobe signal and an external column address strobe signal, said semiconductor memory device comprising:
   (a) internal row address strobe signal generator means for generating a signal synchronous with said external row address strobe signal;
   (b) first internal column address strobe signal generator means for generating a signal synchronous with said external column address strobe signal;
   (c) delay means for developing a delay time when the output of said first internal column address strobe signal generator means changes from a first level to a second level, and then generating an output changing from said first level to said second level,
   (d) second internal column address strobe signal generator means comprising;
   a constant voltage source;
   circuit means providing an output changing from one level to another level in response to said external row address strobe signal bringing to inactive state and changing from said another level to said one level in response to external column address strobe signal bringing to active state;
   first NAND gate means receiving as its one input said external column address strobe signal, said first NAND gate means being provided at the first stage of said second internal column address strobe signal generator means; and
   connection means for connecting one selected from the output of said delay means, the output of said constant voltage source and the output of said circuit means to another input to said first NAND gate means;
   wherein said second internal column address strobe signal generator means generates a signal responsive to said external address strobe signal and the signal inputted through said connection means
   (e) data address signal generator means responsive to the output of said internal row address strobe signal generator means and the output of said second internal column address strobe generator means for generating address signals in connection with the data to be read out from said memory array;
   (f) read out means responsive to the output of said data address signal generator means for reading out a plurality of data from said memory array; and
   (g) output means responsive to a portion of the output of said data address signal generator means, the output of said first internal column address strobe signal generator means and the output of said second internal column address strobe signal generator means for outputting at least one of said plurality of the data read out through said read out means.

2. A semiconductor memory device as set forth in claim 1 wherein said circuit means comprises a second NAND gate constituted by two first MOS transistors receiving as their gate inputs an inverted signal of the output of said internal row address strobe signal generator means and the output of said first internal column address strobe signal generator means, respectively, and the voltage of said constant voltage means is higher than the gate threshold voltage of said first MOS transistors.

3. A semiconductor memory device as set forth in claim 1 wherein said first NAND gate means comprises a second MOS transistor.

4. A semiconductor memory device as set forth in claim 1 wherein said output means comprise:
   a plurality of data register means for storing said plurality of the data read out by said readout means; and
   output select means responsive to said portion of the output of said data address generator means for selecting one of said plurality of the data register means and responsive to the output of said first internal column address strobe signal generator means for outputting data stored in said selected one of the data register means.

5. A semiconductor memory device as set forth in claim 4 wherein said plurality of the data register means are reset in response to the output of said second internal column address strobe signal generator means and said output select means includes shift register means, said shift register means performing shift operation in response to the output of said first internal column address strobe signal generator means.

6. A semiconductor memory device as set forth in claim 4 wherein said data as stored in said plurality of the data register means are N bits long and said portion of the output of said data address generator means for selection of one of said plurality of the data register means are M bits long where N and M are integers and $N = 2^M$.

7. A semiconductor memory device as set forth in claim 4 wherein the output of said data address generator means comprises row addresses signals and column address signals and said M bits are a portion of said column address signals.

8. A semiconductor memory device as set forth in claim 5 wherein said N is 4 and said M is 2.

9. A semiconductor memory device as set forth in claim 1 wherein said connection means for connecting said selected one of the outputs to said another input to said first NAND gate means is aluminum wire.

10. A semiconductor memory device as set forth in claim 9 wherein said aluminum wiring is deposited through the use of a mask.

11. A semiconductor memory device as set forth in claim 10 wherein said aluminum wiring is deposited through a step using the mask after another step of aluminum wiring deposition is carried out in said semiconductor memory device.

* * * * *